United States Patent
Mayberry et al.

(10) Patent No.: US 10,859,444 B2
(45) Date of Patent: Dec. 8, 2020

(54) DETERMINING TEMPERATURE INSIDE A HIGH PRESSURE CELL BY EVALUATING SOLID SOLUTION COMPOSITION

(71) Applicant: DIAMOND INNOVATIONS, INC., Worthington, OH (US)

(72) Inventors: Camille Ellen Mayberry, Ellensburg, WA (US); Emil Tinkov Stoyanov, Dublin, OH (US); Kurt Dylan Leinenweber, Chandler, AZ (US); Abds-Sami Malik, Westerville, OH (US)

(73) Assignee: DIAMOND INNOVATIONS, INC., Worthington, OH (US)

( * ) Notice: Subject to any disclaimer, the term of this patent is extended or adjusted under 35 U.S.C. 154(b) by 400 days.

(21) Appl. No.: 15/701,694

(22) Filed: Sep. 12, 2017

(65) Prior Publication Data
US 2018/0094985 A1    Apr. 5, 2018

Related U.S. Application Data

(60) Provisional application No. 62/402,418, filed on Sep. 30, 2016.

(51) Int. Cl.
| | |
|---|---|
| G01N 25/02 | (2006.01) |
| G01K 1/00 | (2006.01) |
| G01K 13/00 | (2006.01) |
| G01K 1/26 | (2006.01) |
| G01K 11/06 | (2006.01) |

(Continued)

(52) U.S. Cl.
CPC ............. *G01K 1/26* (2013.01); *C01G 23/00* (2013.01); *C30B 29/32* (2013.01); *G01K 3/04* (2013.01); *G01K 11/06* (2013.01); *G01K 11/14* (2013.01); *G01K 11/30* (2013.01); *G01K 19/00* (2013.01); *C01P 2002/50* (2013.01); *C01P 2002/72* (2013.01); *C01P 2002/82* (2013.01)

(58) Field of Classification Search
USPC ................................... 374/16, 141, 100, 208
See application file for complete search history.

(56) References Cited

U.S. PATENT DOCUMENTS

| | | | |
|---|---|---|---|
| 2,941,241 A | 6/1960 | Strong | |
| 2,941,248 A | 6/1960 | Tracy | |

(Continued)

FOREIGN PATENT DOCUMENTS

EP    0631983 A1    1/1995

OTHER PUBLICATIONS

Muller U., Inorganic Structural Chemistry, John Wiley & Sons Ltd., 1991: 8-9.

(Continued)

*Primary Examiner* — Mirellys Jagan

(57) ABSTRACT

A method for the measurement of temperature in high temperature and high pressure processes includes the steps of providing at least a first material compound and at least a second material compound. The at least first and second compounds are mixed to form a material sample. The material sample is loaded into a device and the device and material sample are subjected to a high pressure of up to about 10 GPa and a high temperature of up to about 1700° C. to form the material sample into a solid crystalline solution. The material sample is recovered for analysis and the composition of the crystalline solid solution is measured to determine the temperature.

11 Claims, 12 Drawing Sheets

(51) Int. Cl.
*C01G 23/00* (2006.01)
*G01K 3/04* (2006.01)
*C30B 29/32* (2006.01)
*G01K 11/14* (2006.01)
*G01K 11/30* (2006.01)
*G01K 19/00* (2006.01)

(56) References Cited

U.S. PATENT DOCUMENTS

| | | |
|---|---|---|
| 2,947,611 A | 8/1960 | Bundy |
| 3,415,122 A | 12/1968 | Yee |
| 3,609,818 A | 10/1971 | Wentorf |
| 3,767,371 A | 10/1973 | Wentorf et al. |
| 4,289,503 A | 9/1981 | Corrigan |
| 4,673,414 A | 6/1987 | Lavens et al. |
| 4,954,139 A | 9/1990 | Cerutti |
| 9,243,968 B2 | 1/2016 | Gullikson et al. |
| 2001/0048143 A1 | 12/2001 | Criswell et al. |
| 2004/0082069 A1 | 4/2004 | Jiang et al. |
| 2014/0151604 A1 | 6/2014 | Gullikson et al. |

OTHER PUBLICATIONS

West, Anthony R, Solid State Chemistry and its Applications, John Wiley & Sons Ltd., 1984: 358-359.
Gullikson, A.L., et al., High-pressure investigation in the system $SiO_2$—$GeO_2$: Mutual solubility of Si and Ge in quartz and rutile phases. Journal of the American Ceramic Society, 2014.
Kawai, N. et al, "The Generation of Ultrahigh Hydrostatic Pressures by a Split Sphere Apparatus," Rev Sci Instrum 41, 1178 (1970).
Stoyanov, E. et al, "Large-Volume Multianvil Cells Designed for Chemical Synthesis at High Pressures," High Pres Res 30, 175 (2010).
Walker, D. et al, "Some Simplifications to Multianvil Devices for High Pressure Experiments," Am Mineral 75, 1020 (1990).

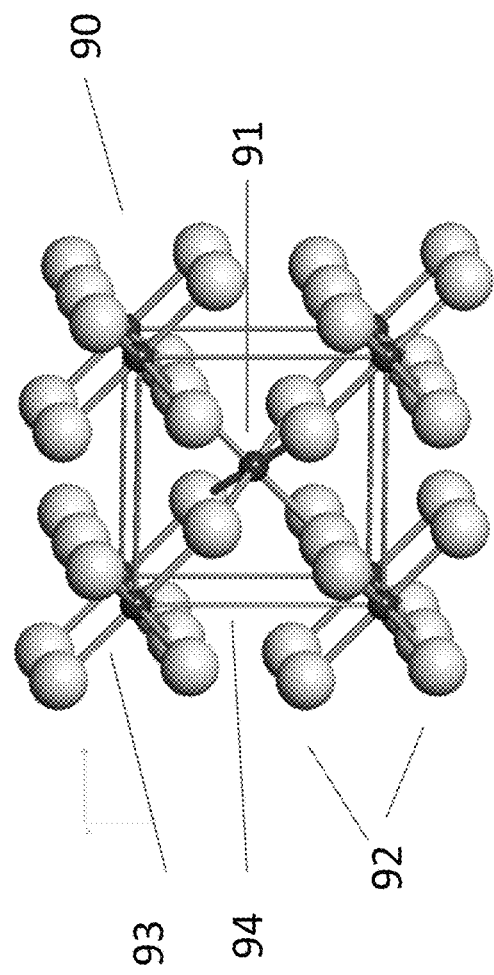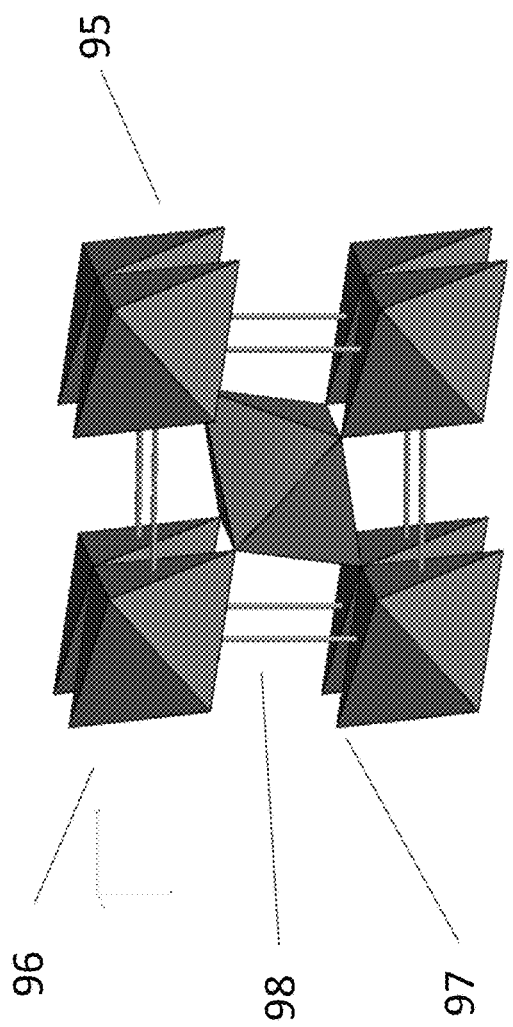

DETERMINING TEMPERATURE INSIDE A HIGH PRESSURE CELL BY EVALUATING SOLID SOLUTION COMPOSITION

TECHNICAL FIELD AND INDUSTRIAL APPLICABILITY

The present disclosure relates to a method for measuring high temperatures, up to about 1700° C., at high pressures, up to about 10 GPa, and more particularly, to the accurate measurement of these temperatures at the pressures attained during industrial processes.

SUMMARY

In one embodiment a method for the measurement of high temperature in high pressure processes includes the steps of providing at least a first material compound and at least a second material compound. The at least first and second compounds are mixed to form a material sample. The material sample is loaded into a device and the device and material sample are subjected to a high pressure of up to about 7 GPa and a high temperature of up to about 1700° C. to form at least part of the material sample into a solid crystalline solution. The material sample is recovered for analysis and the composition of the crystalline solid solution is measured to determine the temperature ex situ.

BRIEF DESCRIPTION OF THE DRAWINGS

These and other objects, features, aspects, and advantages will become more apparent from the following detailed description of the preferred embodiments relative to the accompanied drawings, in which:

FIG. 9A is a ball and stick representation of the crystal structure of $Ge0.57Ti0.43O2$ and FIG. 9B is a polyhedral representation of the same, emphasizing the coordination of the oxygen atoms.

DETAILED DESCRIPTION

Figure 1:
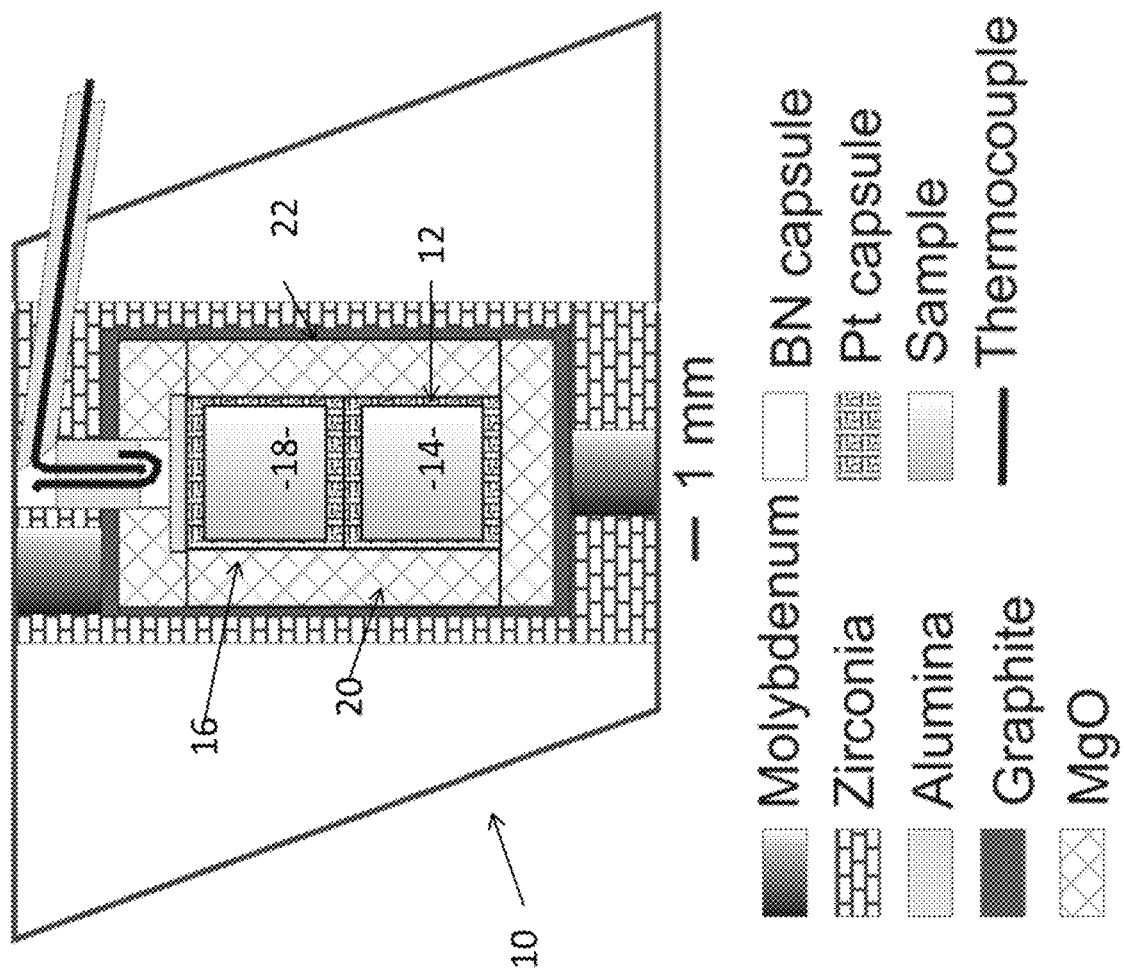
FIG. 1 is a cross-sectional view of a known multi-anvil cell assembly used for the experiments of the present invention.

Industrial scale high pressure and temperature (HPHT) processes employ pressures ranging up to approximately 10 GPa and temperatures ranging up to approximately 2200° C. These extreme pressure and temperature environments are obtained in specially designed cells in hydraulic presses. Such temperature and pressure conditions are necessary to manufacture, for example, diamond and/or cubic boron nitride.

Measurement of the temperature experienced by the internal components of the cell may be desired as a way to determine process parameters and the effects of those process parameters on resulting press operations. Further, in some embodiments, the temperature experienced throughout the cell may not be uniform, and so means for measuring temperature at various positions within the cell may also be desired.

Various industrial processes may be performed in a HPHT apparatus, which subjects material in the HPHT apparatus to conditions of elevated pressure and temperature. A conventional HPHT apparatus may be of the belt- or die-type as described in U.S. Pat. Nos. 2,947,611; 2,941,241; 2,941,248; 3,609,818; 3,767,371; 4,289,503; 4,673,414; and 4,954,139; each of which is incorporated herein in its entirety; or of a multi-anvil type as described in: Kawai, N. et al, "The Generation of Ultrahigh Hydrostatic Pressures by a Split Sphere Apparatus," Rev Sci Instrum 41, 1178 (1970); Stoyanov, E. et al, "Large-Volume Multianvil Cells Designed for Chemical Synthesis at High Pressures," High Pres Res 30, 175 (2010); and Walker, D. et al, "Some Simplifications to Multianvil Devices for High Pressure Experiments," Am Mineral 75, 1020 (1990); each of which is incorporated herein in its entirety.

However, it will be appreciated that the method of the present disclosure will find applicability in any HPHT apparatus that is capable of providing the required high pressure and high temperature conditions simultaneously. Accordingly, it is intended that such other HPHT apparatuses are envisioned to be within the scope of the present disclosure.

It is desirable to measure the temperatures attained in such industrial high pressure equipment accurately and continuously. While it is possible and feasible to continuously and accurately measure the internal temperature, with, for example, a thermocouple; it is not feasible, at present, to map the temperature distribution within a cell.

Temperature measurement with a thermocouple (usually K-type or C-type) will yield the temperature at a single point where the junction of the thermocouple is positioned, which is typically in the geometric center of the high pressure cell. There is, however, a temperature gradient that exists within the high pressure cell during the HPHT process. Measuring such a temperature gradient would require multiple thermocouples and necessitate extensive modifications of the HPHT cell. This would be a cumbersome and costly experiment. Also, the results attained may not be directly relatable to a standard HPHT cell that does not include such instrumentation, because of the cell design modifications required to accommodate multiple thermocouples may modify the internal temperatures experienced within the cell.

A need exists for an alternative method for measuring temperature at multiple points within a HPHT cell, preferably a method that is comparatively simple and accurate. The present disclosure is directed to a temperature measurement technique that is practical for industrial use and does not require substantial thermocouple instrumentation.

The present disclosure is directed to a sensor material that undergoes a permanent transformation during the HPHT process, such that upon inspection of the sensor material following the HPHT process, the conditions of the HPHT process can be determined. The sensor material may respond to the maximum temperature experienced during the HPHT process, such that the sensor material undergoes a permanent transformation that corresponds to one of the parameters of the HPHT process. In one embodiment, the sensor material may undergo a phase transformation, such that the composition of the sensor material changes based on the maximum temperature that was seen during the HPHT process. By evaluating the composition of the sensor material after the HPHT process, the maximum temperature of the HPHT process can be determined ex situ.

It has been found that when a sensor material includes a mixture of titanium dioxide ($TiO_2$) and germanium dioxide ($GeO_2$) and is subjected to pressures ranging up to about 10 GPa and temperatures up to about 1700° C., a solid solution begins to form. This solid solution crystallizes in a tetragonal structure (space group #136) and the amount of intermixing of the $TiO_2$ and the $GeO_2$ depends directly on the maximum temperature witnessed by the $TiO_2$—$GeO_2$ material. This material, although formed at high pressure, can be recovered and is stable at room pressure. The crystallized solid solution can be measured by, for example, electron microprobe analysis, to quantify the amount of Ti and Ge in the solid solution. Raman spectroscopy can be used to indirectly quantify the solid solution because as the solid solution composition changes, the lattice vibration modes of the crystal changes. Indirect quantification of the solid solution can also be made by X-ray diffraction because, as the composition of the $TiO_2$/$GeO_2$ solid solution varies, the crystal lattice parameter varies, leading to observable changes in the diffraction pattern.

The present disclosure is directed to techniques for measurement of temperatures at pressures up to about 10 GPa ex situ, which is useful, for example, in mapping internal cell temperatures in industrial HPHT processes. This technique allows for simple measurement of cell temperature without heavy instrumentation requirements, at industrially relevant pressures and temperatures, using widely available analytical tools. In one embodiment, the measurement technique relies on the formation of a solid solution of $TiO_2$ and $GeO_2$. Such solid solution forms at temperatures greater than about 1200° C. The composition of the solid solution varies continuously with increasing temperature. This solid solution may form a crystalline structure that is maintained as the sensor material is brought to ambient pressure and temperature conditions. The solid solution, therefore, is recoverable and the composition of the solid solution can be determined at ambient conditions by, for example, electron microprobe, X-ray diffraction, or Raman spectroscopy.

In one embodiment, the sensor material may be placed in a high pressure cell of conventional design for subsequent processing in a HPHT apparatus. The sensor material is recovered as a sintered body by removing the cell components, for example by mechanical separation from platinum or other metal foil (in the case of metal capsules) or dissolving the surrounding salt in a solution (in the case of salt capsules). The sintered sensor material may be prepared for subsequent evaluation according to conventional processing techniques. For electron microprobe analysis, the sintered sensor material is polished and carbon-coated. For powder X-ray diffraction, the sintered sensor material is ground in an agate mortar. For Raman spectroscopy, the sintered sensor material may be used "as is" as recovered from the HPHT apparatus or ground into a powder.

The present disclosure is directed to different experimental procedures. In one embodiment of an HPHT procedure, high purity (≥99%) $TiO_2$ and $GeO_2$ powders are mixed together. The ratio of the $TiO_2$ to $GeO_2$ may be varied to provide sensitivity to the appropriate temperature range and may vary from about 30:70 to about 70:30 molar percent ratio, including being from about 40:60 to about 60:40 molar percent ratio, including being in about a 50:50 mole percent ratio. The powder is then loaded in a capsule and assembled into a high pressure cell and subjected to a pressure of up to about 10 GPa and a temperature of up to about 1700° C. and held at constant pressure and temperature for a time period ranging from minutes to hours. The cell is allowed to cool rapidly (for example, >1000° C./minute) prior to pressure release, and the sintered sensor material is recovered for analysis.

In some embodiments, temperature may be measured using additional instrumentation. In one embodiment, a C-type thermocouple may be inserted in the cell to monitor a temperature. A pressure standard (see U.S. Pat. No. 9,243,968, which is incorporated by reference) may also be loaded concurrently into the HPHT apparatus, in a separate capsule, as a way to determine the pressure of the HPHT process.

After recovery, the capsules containing the temperature-sensing sensor material and pressure standard (if present) are each sectioned to evaluate the temperature or pressure at a position within the high pressure cell. In one embodiment, the recovered sintered sensor material is cut approximately along the vertical axis to evaluate the temperature of the HPHT process along the middle of the high pressure cell. In one experiment, one half of each of the temperature-sensing sensor material and the pressure standard were mounted in epoxy for electron probe microanalysis. The other half of each of the temperature-sensing sensor material and the pressure standard were subjected to powder X-ray diffraction.

In various embodiments, the starting $TiO_2$ and $GeO_2$ that together form the sensing material may be crystalline or amorphous. In embodiments in which the $TiO_2$ and $GeO_2$ are amorphous, it is preferable for the $TiO_2$ and $GeO_2$ to be combined as a glass (employing conventional glass making techniques) prior to HPHT processing. A mixture of $TiO_2$ and $GeO_2$ may also be derived from sol-gel techniques by reacting alkoxides of Ti and Ge.

In various experiments, an X-ray diffraction analysis (XRD) procedure was performed on the recovered sensor material in Bragg-Brentano geometry using Cu Kα radiation generated at 40 keV and 30 mA on a Siemens D5000 diffractometer, or generated at 40 keV and 40 mA on a Bruker D8 diffractometer, in both cases using a zero background holder made from single crystal quartz (obtained from The Gem Dugout of State College, Pa.). In some experiments, the sensor materials were mixed with a lanthanum hexaboride standard (from National Institute of Standards and Technology, reference material number 660) in order to more accurately determine the cell parameters of the phases present in the sensor material following HPHT processing. The cell parameters, accurate to $10^{-3}$ Å, were determined with a combination of peak-fitting procedures on the Jade™ software package and/or Rietveld refinement on the GSAS software package.

Single crystal X-ray diffraction analysis was performed on a Bruker SMART APEX instrument using a Mo X-ray source at a wavelength of 0.71 Å. Structure solution and refinement was done using Bruker SHELXTL software.

An experimental procedure incorporating electron μ-probe analysis was done on a Jeol JXA-8530F field emission Electron Probe Microanalyzer (EPMA) equipped with an energy dispersive spectrometer and operated at 15 kV and 15 nA, with a focused beam to determine titanium to germanium ratios. Using energy dispersive spectrometry, titanium and germanium concentrations were derived from continuous X-ray spectrum for analysis spots with dwell times of 30 seconds per analysis and a standardless method that employs an internal matrix correction. The measured elemental concentrations were calculated as oxide wt % and normalized to 100 wt % totals from the absolute intensities of the characteristic X-ray peaks of the respective elements. Oxygen abundances were calculated from stoichiometry.

Figure 2:
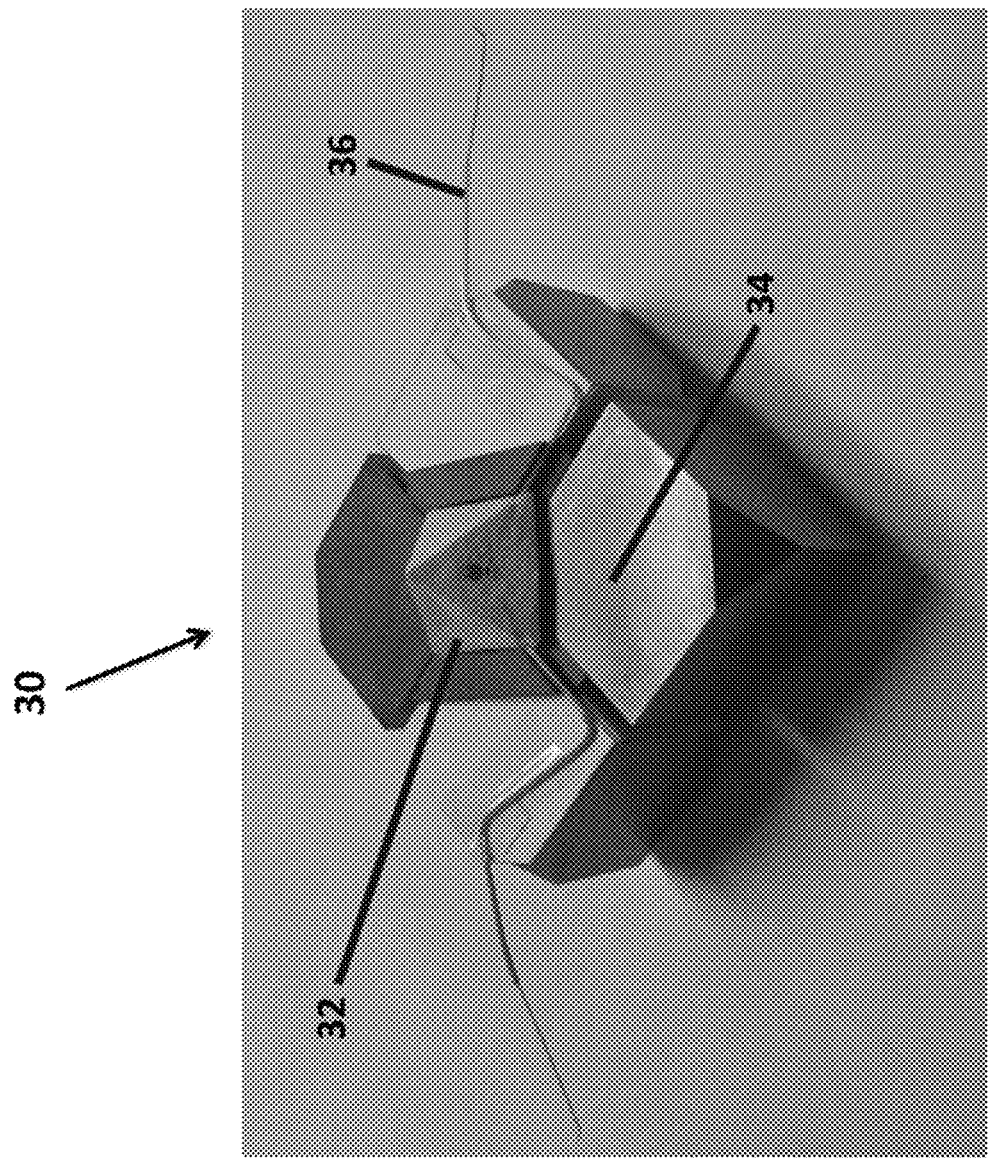
FIG. 2 is a perspective view of a known octahedral high pressure cell used between 3 and 10 GPa in the experiments of the present invention.

Referring to FIGS. 1-2, various assembly devices can be used to practice the methodology of the present disclosure. As shown in FIG. 1, a multi-anvil cell assembly 10 includes a sample capsule 12 that receives a sensor material 14, for example, $TiO_2$ and $GeO_2$ powder. A standard capsule 16 receives a pressure standard material 18. The sensor material and pressure standard are enclosed in separate, chemically sealed platinum capsules 12, 16. Capsules 12, 16 are encased in sleeves 20. Sleeves 20 can be made of MgO or other appropriate material as conventionally known. Sleeves 20 are in turn surrounded by a furnace 22 that heats the capsules 12, 16 during the HPHT process. The furnace 22 may be made of, for example, graphite. Thermal insulation, such as zirconia ($ZrO_2$), may surround sleeve 20.

As shown in FIG. 2, an octahedral pressure medium forming a high pressure cell 30 may be used between about 3 and about 10 GPa. In one embodiment, the octahedron may be about 18 mm on an edge, however it should be appreciated that the present disclosure contemplates a variety of sizes. Pyrophylite gaskets and paper backing may also be used. The assembly is surrounded by eight tungsten carbide cubes 34, each truncated to about 12 mm on a corner. A thermocouple may be arranged such that the thermocouple leads 36 extend through the gaps between adjacent carbide cubes. FIG. 2 shows the octahedral pressure medium 32 resting on four of the eight carbide cubes. The remaining four cubes (not shown) are placed over the top of the octahedron, so the pressure is applied to all 8 faces of the octahedral high pressure cell 30. Forces are applied on the high pressure cell 30 in all eight directions through the eight cubes in the "6-8" geometry. See Kawai et al. Further details of the HPHT apparatus and high pressure cell are provided in Stoyanov et al.

Figure 3:
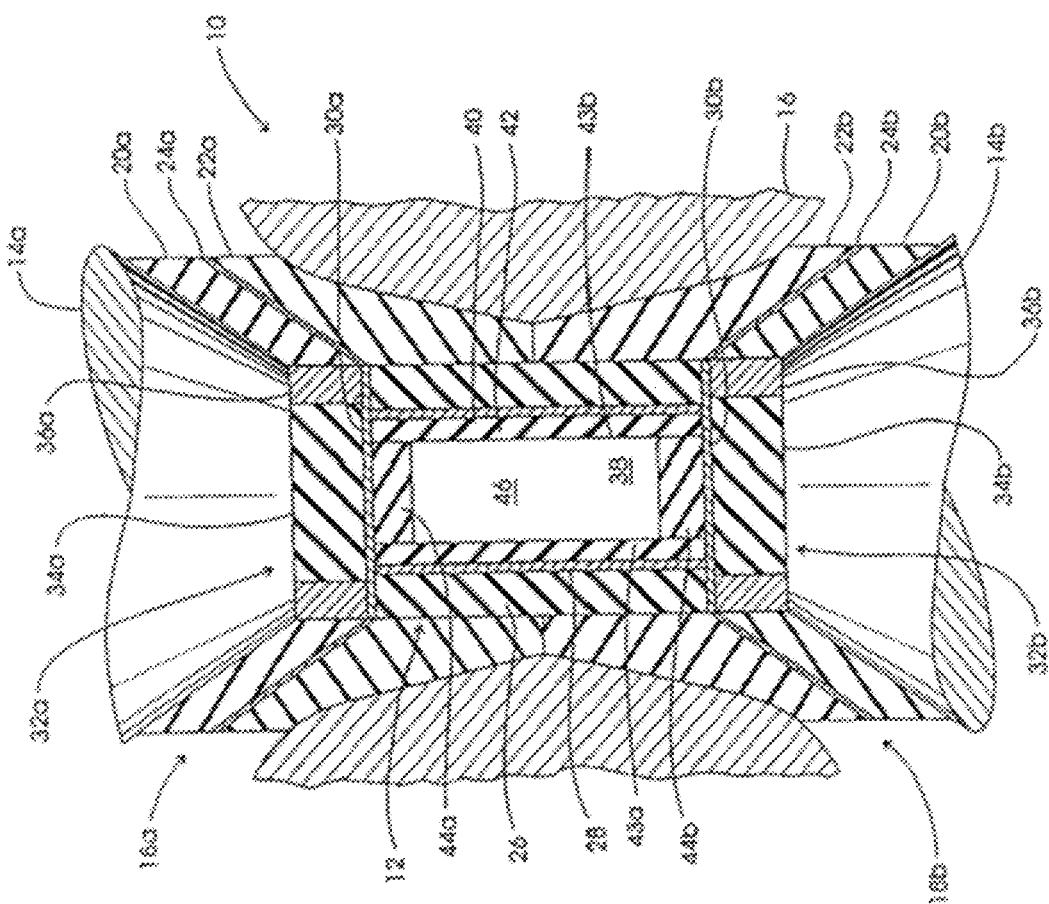
FIG. 3 is a cross-sectional view of a known belt-type high pressure apparatus used for the experiments of the present invention.

Referring now to FIG. 3, the sensor material of the present disclosure may be used to evaluate the temperature in another illustrative HPHT apparatus 10, which includes a generally cylindrical reaction cell assembly 12 interposed between a pair of punches, 14a and 14b, and surrounded by a generally annular belt member or die member 16. Preferably, both punches 14 and the belt member 16 are formed of a relatively hard material, such as cemented tungsten carbide. Between the punches 14 and the angular belt member 16 are a pair of insulating assemblies, 18a and 18b, each of which is formed of a pair of thermally and electrically insulating members, 20a-b and 22a-b. In some embodiments, the electrically insulating members 20a-b and 22a-b are formed of pyrophyllite or the like, and have an intermediate metallic or other gasket, 24a and 24b, disposed there between.

As depicted, the reaction cell assembly 12 includes a hollow cylinder 26, which may be formed of a material such as salt or the like, which is converted during the HPHT process by phase transformation or compaction to a stronger, stiffer state. Alternatively, the hollow cylinder 26 may be formed of a talc material or the like, which is not converted during the HPHT process. In either case, the material of cylinder 12 is selected as being substantially free of volume discontinuities or the like, at ambient conditions and under HPHT conditions as may occur. Such materials may include, for example, pyrophyllite or alumina. Materials meeting such criteria are described in U.S. Pat. No. 3,030,662, which is incorporated herein in its entirety.

One or more adjacent cylinders are positioned within salt cylinder 26. Each of the adjacent cylinders 28 are provided as a graphite electrical resistance heater tube. Electrical connection with heater tube 28 is achieved via an adjacent pair of conductive metal end discs, 30a and 30b, which are axially-disposed with respect to heater tube 28. An end cap assembly, shown generally at 32a and 32b, is provided adjacent to each disc 30. Each of the end cap assembly 32a, 32b, may include an insulating plug 34a, 34b, which is surrounded by an electrically conductive ring 36a, 36b.

It will be appreciated that the interior of heater tube 28, along with end discs 30, salt cylinder 26, and end cap assemblies 32, defines a generally-cylindrical inner chamber 38 having defined axial and radial extents and containing a pressure-transmitting medium 46. Pressure-transmitting medium 46 is selected as having a relatively low coefficient of internal friction to make it semi-fluid at HPHT conditions, and may be provided as or within a cylindrical salt liner 42, which defines radial pressure-transmitting medium layers 43a, 43b, and is fitted with an axial pair of salt plugs 44a, 44b, each of which defines an axial pressure transmitting medium layer. In some embodiments, pressure-transmitting medium 46, salt liner 42, and/or plugs 44 are formed of a graphite material or of sodium chloride, but also may be formed of any chloride, iodide, or bromide of sodium, potassium, or calcium or a mixture thereof. Alternatively, pressure-transmitting medium 46 may be provided in powdered or particulate form. The pressure-transmitting medium 46 defines a cavity space 40, which is configured to receive capsules of the material(s) to be HPHT treated.

Figure 4:
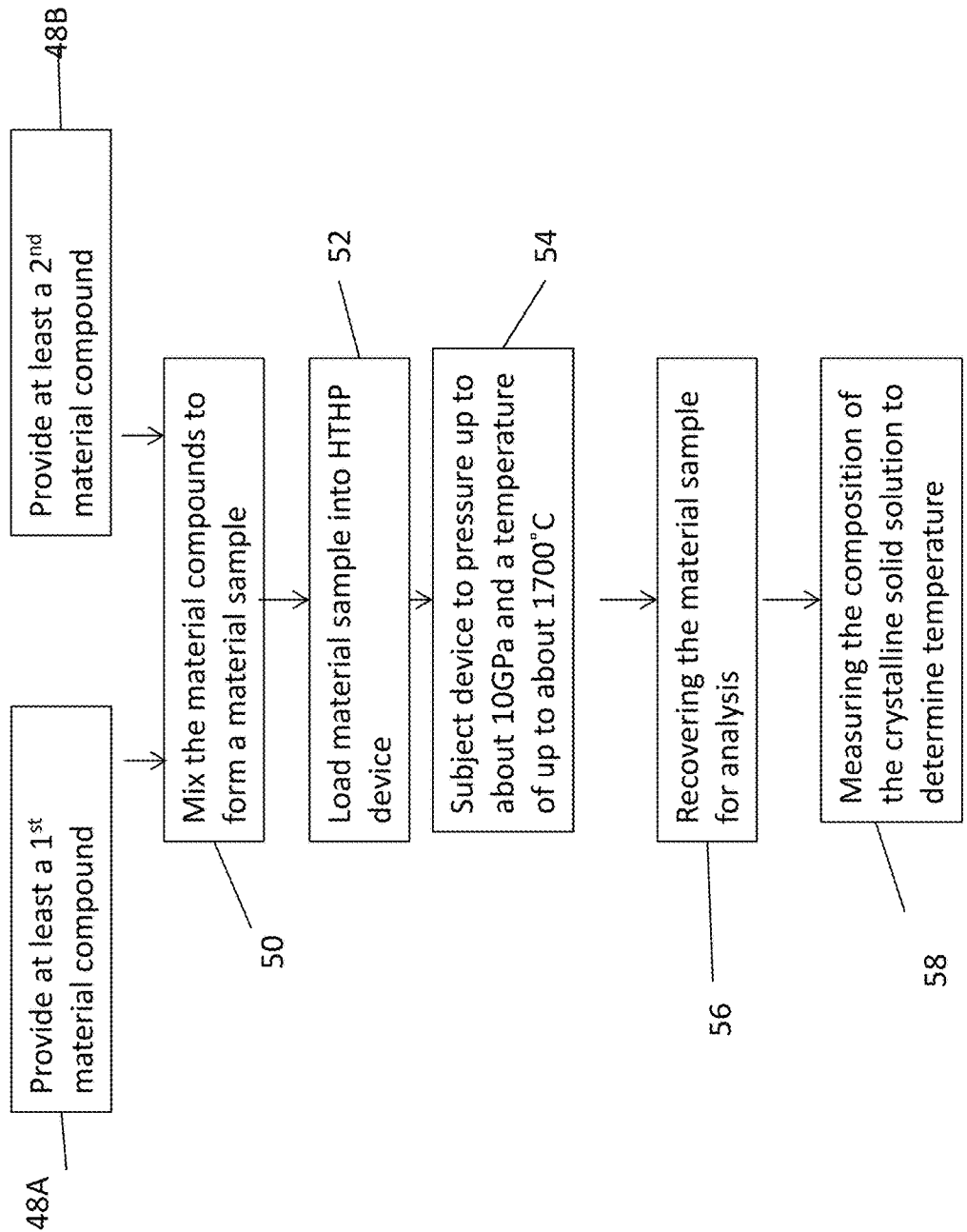
FIG. 4 is a flow diagram of the methodology of the present invention.

Referring now to FIG. 4, the method of the present disclosure includes the steps of providing a sensing material. Referring to steps 48A and 48B, at least a first and second material compound is provided. It should be appreciated that a plurality of material compounds may be provided. The material compounds may differ from one another. For example, as will be described further in detail in the following examples, a first material compound may be a $TiO_2$ powder and the second material compound can be a $GeO_2$ powder. Particular embodiments that were evaluated are provided in the following description and tables below, which may be referred to for additional information.

Still referring to FIG. 4, in step 50 the material compounds are mixed together to form the sensor material. As set forth by the specific examples and tables below, the powders may be ground and dried, or formed into a glass by conventional means. Referring to step 52, the sensor material is then loaded into a capsule of the HPHT apparatus, as described above. A pressure standard may also be loaded into a capsule for processing in an HPHT apparatus as described in the specific examples below.

As shown in step 54 the material sensor that is positioned within the capsule, and as described above with reference to FIGS. 1-3, is subjected to pressures up to about 10 GPa and temperatures of up to about 1700° C. The pressure and temperature may be held at elevated values for a predetermined time as set forth below.

During step 54, the sensor material is formed into a solid crystalline solution. For purposes herein a solid crystalline solution is defined as a solution of a crystalline phase that can have variable composition. See West, Anthony R, *Solid State Chemistry and its Applications*, John Wiley & Sons Ltd., 1984: 358-359.

Each compound of the sensor material has a crystal lattice parameter. For example, the $TiO_2$ and $GeO_2$ powders each have a crystal lattice parameter. For purposes herein a crystal lattice parameter is defined as a unit cell structure of lengths of the base vectors (of the unit cell) and the angles between them together forming the lattice parameters (or lattice constants). See, Midler U., *Inorganic Structural Chemistry*, John Wiley & Sons Ltd., 1991: 8-9.

During the formation of the solid crystalline solution, the crystal lattice parameters will change. For example, the Ti enters and changes the crystal lattice parameter of the $GeO_2$. Or the Ge enters and changes the crystal lattice parameter of the $TiO_2$. Similar events can occur with other material compounds. The amount of atomic exchange between the components of the sensor material may be affected by the maximum temperature experienced by the sensor material.

Following HPHT processing, the sensor material is recovered for analysis in step 56. During the evaluation step 58, the concentration of the first material compound in the second material is measured. Likewise, the concentration of the second material compound in the first material may be measured.

As set forth fully in the examples and tables below, the amount of Ti and Ge in the solid crystalline solution may be measured directly by electron microprobe analysis. The amount of Ti and Ge in the solid crystalline solution may also be measured indirectly by X-ray diffraction, wherein the crystal lattice parameter continuously varies with the composition of the $TiO_2$ and $GeO_2$ solid solution. Further, these crystal lattice changes can also be detected by Raman spectroscopy, where the resonance frequencies of the crystal are affected by the composition.

Accordingly, the composition of the solid crystalline solution that is present in the recovered sensor material may be used as a temperature gauge. Moreover, the crystal lattice parameter of the solid crystalline solution that is present in the recovered sensor material can be used as a temperature gauge.

Experimental results using particular embodiments are explained below and listed in Table 1.

TABLE 1

| Sample | $TiO_2$—$GeO_2$ (mg) | $SiO_2$—$GeO_2$ (mg) | Pressure (kBar) | Temp. (° C.) | Time (min) |
|---|---|---|---|---|---|
| G248 | *29.74 | 1.88 | | 1200 | 120 |
| G249 | *?? | 5.60 | 2.83 | 1400 | 120 |
| G250 | *35.60 | n/a | | 1200 | 26 |
| G260 | ?? | ?? | 5.88 | 1500 | 120 |
| G265 | 9.22 | 16.66 | 5.35 | 1400 | 120 |
| G266 | 18.47 | 23.54 | 3.72 | 1300 | 120 |
| G267 | 16.92 | 18.27 | 5.26 | 1600 | 120 |
| G273 | 13.42 | n/a | 5.48 | 1400 | 120 |
| G278 | 19.03 | 23.99 | 6.24 | 1300 | 120 |
| ~G284 | 21.25 | 21.94 | ?? | 1400 | 120 |
| G285 | ^21.55 | 21.049 | ?? | 1450 | 120 |

*50:50 molar composition. Subsequent samples were 60:40::$TiO_2$:$GeO_2$.

An equimolar composition of $GeO_2$ (99.98% purity, Alfa Aesar) and $TiO_2$ (anatase structure, 99.9% purity, Alfa Aesar) were mixed in an agate mortar and pestle with isopropanol until dryness. The powder mixture was further dried by heating at 500° C. for 1 hour, in an alumina crucible, under air. This solid mixture was stored under vacuum of 0.1 MPa at 100° C. and used for subsequent experiments.

Pt capsules were fabricated from Pt tubes (5 mm diameter, 9 mm length, 0.127 mm wall thickness) and Pt end lids (0.127 mm thickness, 5 mm diameter) sourced from Depths of the Earth Inc. Capsules made from Pt were charged with sensor material and pressure standard, as described herein above, and then welded shut.

After HPHT processing, capsules containing sensor material and pressure standard were mounted in epoxy resin and cut in half along the length using a diamond wire saw. Generally, one half of the recovered sensor material was used for SEM analysis and the remaining half was used for XRD analysis.

In one embodiment (Sample G248), 0.2974 grams of sensor material (composition described in Table 1) and 0.0188 grams of pressure standard were each loaded in Pt capsules. Capsules were loaded into the assembly 30 of FIG. 2 and compressed for 120 minutes at 1200° C., then quenched isobarically and recovered for SEM and XRD analysis, as described above.

Samples G249 and G250 were treated in a similar manner. The remaining samples (G260-G285) used molar composition 60:40:$GeO_2$:$TiO_2$, because this ratio provides for a higher solvus temperature, thereby increasing the upper limit for temperature measurement.

A second series of sensor materials, listed in Table 2 below, were pressed on industrial high pressure apparatus, either belt or multi-anvil (*) type. All experiments used a glass having a 60:40 molar composition $GeO_2$—$TiO_2$, as well as a pressure standard charged into a second capsule and subjected to HPHT conditions simultaneously with the sensor material. The glass was ground to a powder in an agate mortar and pestle. An additional temperature measurement of the cell was evaluated using a type 'C' thermocouple that was inserted into the high pressure cell.

In sample M09-10272, salt capsules were separately charged with the glass sensor material and the pressure standard and loaded into a HPHT cell as shown in FIG. 3. The capsules and their contents were subjected to HPHT conditions of about 6.7 GPa and about 1443° C. for about 30 minutes, followed by cooling for about 15 minutes to room temperature and releasing pressure non-isobarically to atmospheric pressure to recover the sample. Remaining samples in the series M09 were processed in a similar fashion.

In sample C2-4155, Pt capsules were separately charged with the glass sensor material and the pressure standard before loading into the high pressure cell. Samples were cooled over 20 minutes and pressure was released isobarically to recover samples. Pressure was not verified independently in five of the samples but are expected to be in the range of 5.0 to 7.0 GPa.

TABLE 2

| Sample | $TiO_2$—$GeO_2$ (mg) | Pressure (GPa) | Temp. (° C.) | Time (min) |
|---|---|---|---|---|
| M09-9059 | 200.0 | 6.6 | 1507 | 30 |
| M09-10272 | 200.0 | 6.7 | 1443 | 30 |
| M09-10273 | 210.0 | 6.8 | 1505 | 30 |
| M09-10275 | 210.0 | 6.8 | 1530 | 30 |
| M09-10281 | 210.0 | 6.8 | 1475 | 30 |
| M09-10929 | 80.0 | 6.5 | 1325 | 30 |
| M09-10930 | 80.0 | 6.9 | 1512 | 30 |
| C2-4155 | 307.2 | 5.4 | 1519 | 20 |
| C2-4156 | 62.7 | ? | 1644 | 20 |
| C2-4223 | 240.4 | ? | 1644 | 20 |
| C2-4224 | 264.9 | ? | 1755 | 20 |
| C0-186 | 266.0 | ? | 1755 | 20 |
| C0-187 | 219.1 | ? | 1644 | 20 |
| C0-188 | 145.6 | 5.2 | 1519 | 20 |

Further to the above, $TiO_2$ is well known to exist in three forms at room temperature and pressure: rutile, anatase, and brookite. The former is by far the predominant form both in nature and in commercial applications (as a white pigment). Rutile is also thermodynamically more favored at atmospheric pressure and the other structures will transform to it upon heating. All three phases feature Ti in octahedral coordination with O. The crystal structure of rutile is tetragonal (space group #136).

$GeO_2$, unlike $TiO_2$, can exhibit either tetrahedral or octahedral coordination of the cation at atmospheric pressure. See Gullikson, A. L., et al., *High-pressure investigation in the system $SiO_2$—$GeO_2$: Mutual solubility of Si and Ge in quartz and rutile phases*. Journal of the American Ceramic Society, 2014. At high temperatures near its melting point, $GeO_2$ has a quartz-like structure, with Ge in tetrahedral coordination. At temperatures below 900° C. $GeO_2$ has a rutile-like structure (the mineral argutite), with Ge in octahedral coordination. The rutile structure of $GeO_2$ becomes more stable with increasing pressure, and is the predominant phase above 2 GPa. The embodiments described herein were all obtained above 2 GPa and were composed of two phases: a titanium-rich phase ($TiO_2$ with rutile structure) and a germanium-rich phase ($GeO_2$ with rutile structure).

Figure 5A:
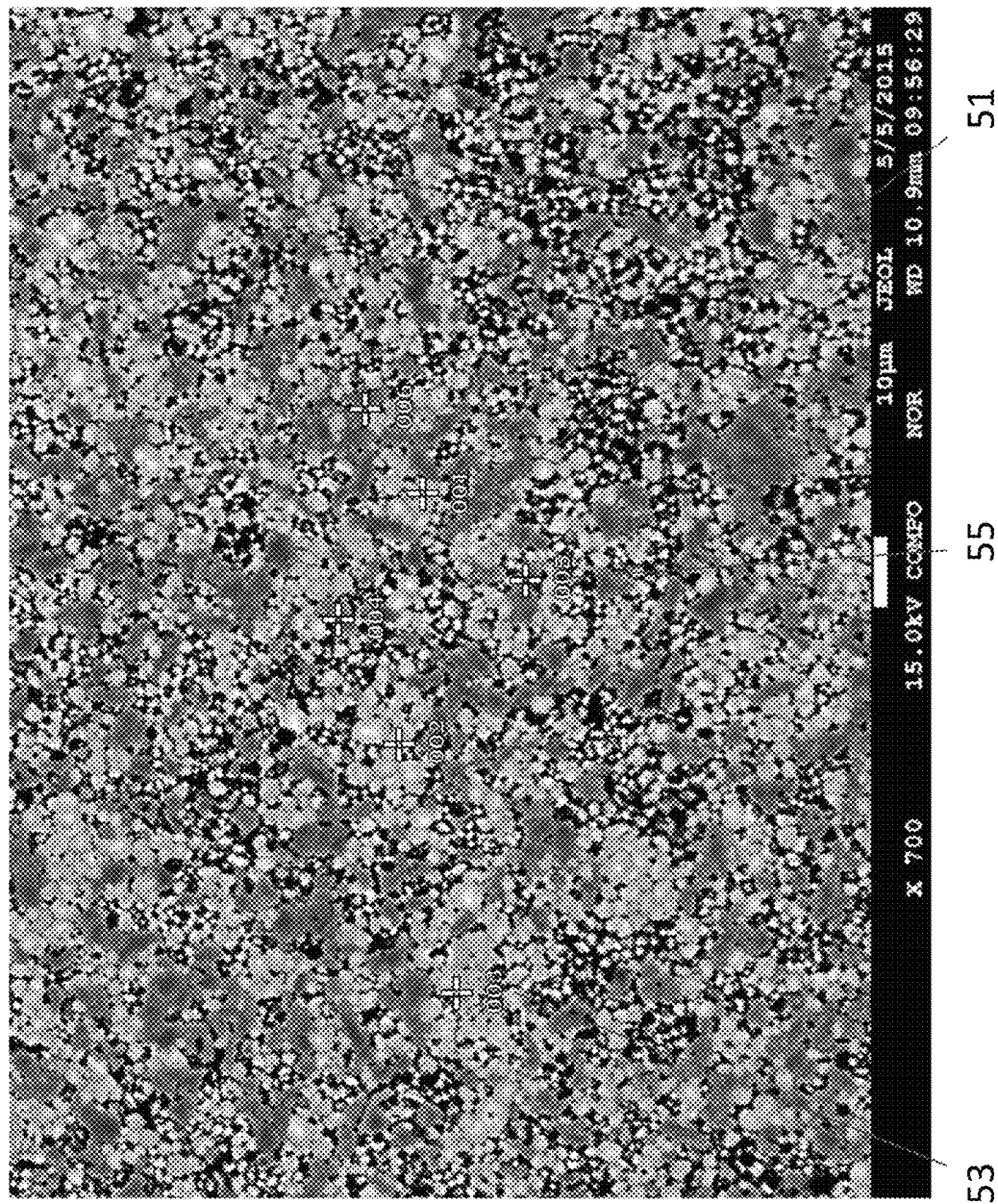
FIG. 5A is a scanning electron microscope image of a representative $GeO_2$—$TiO_2$ solid solution after high pressure and temperature sintering. The numbered crosses mark points at which elemental composition was measured.
Figure 5B:
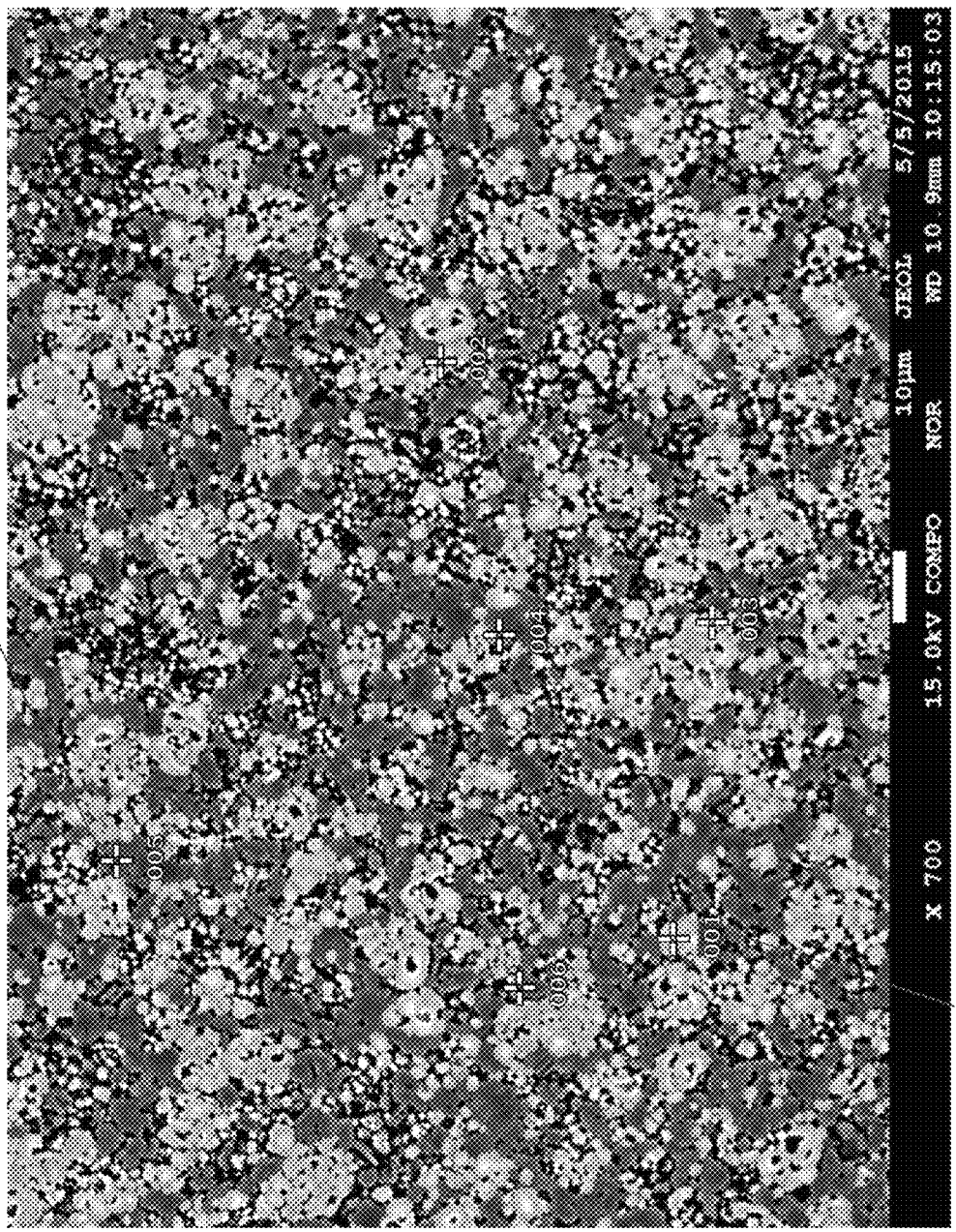
FIG. 5B is a scanning electron microscope image of a representative $GeO_2$—$TiO_2$ solid solution after high pressure and temperature sintering. The numbered crosses mark points at which elemental composition was measured.

FIG. 5A and FIG. 5B show scanning electron microscope (SEM) micrographs of representative $TiO_2$—$GeO_2$ solid solutions taken at 700× magnification. It can be seen that there are both light colored areas 51, 53, 57 and darker colored areas 55, 59. The light colored areas 51, 53, 57 are the germanium rich areas, and the dark colored areas 55, 59 are the titanium rich areas of the solid solution. The numbered crosses 51, 53, 55, 57, 59 mark points at which elemental composition was measured using energy dispersive analysis by X-ray (EDAX) techniques. These sampled compositions are listed below in Table 3. It can be seen that the lighter region, point 1 on FIG. 5A, 51, has more germanium, while the darker region, point 5 on FIG. 5A, 55, has more titanium. These varying compositions of solid solutions can also be observed in their Raman spectra.

TABLE 3

| | FIG. 5A | | FIG. 5B | |
|---|---|---|---|---|
| | $TiO_2$ | $GeO_2$ | $TiO_2$ | $GeO_2$ |
| 1 | 24.79 | 75.21 | 20.27 | 79.73 |
| 2 | 21.16 | 78.84 | 23.71 | 76.29 |
| 3 | 24.65 | 75.35 | 23.68 | 76.32 |
| 4 | 53.78 | 46.22 | 49.34 | 50.66 |
| 5 | 56.90 | 43.10 | 57.17 | 42.83 |
| 6 | 36.54 | 63.46 | 57.78 | 42.22 |

Figure 6A:
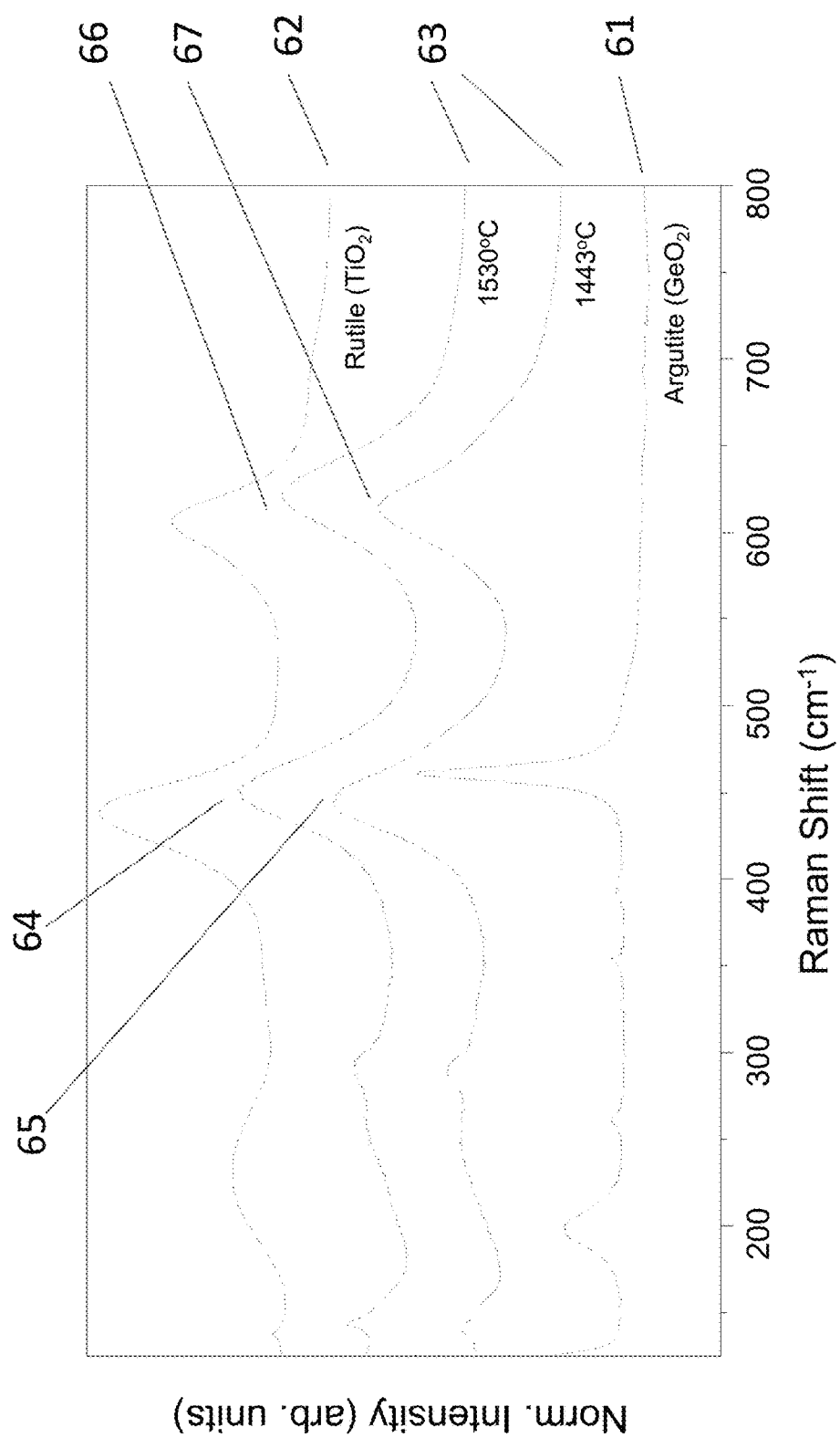
FIG. 6A is the Raman spectra of argutite ($GeO_2$) and natural rutile ($TiO_2$) solid-solution end-members (bottom and top spectra, respectively), and $TiO_2$-rich rutile structured phases at 1443° C. and 1530° C.
Figure 6B:
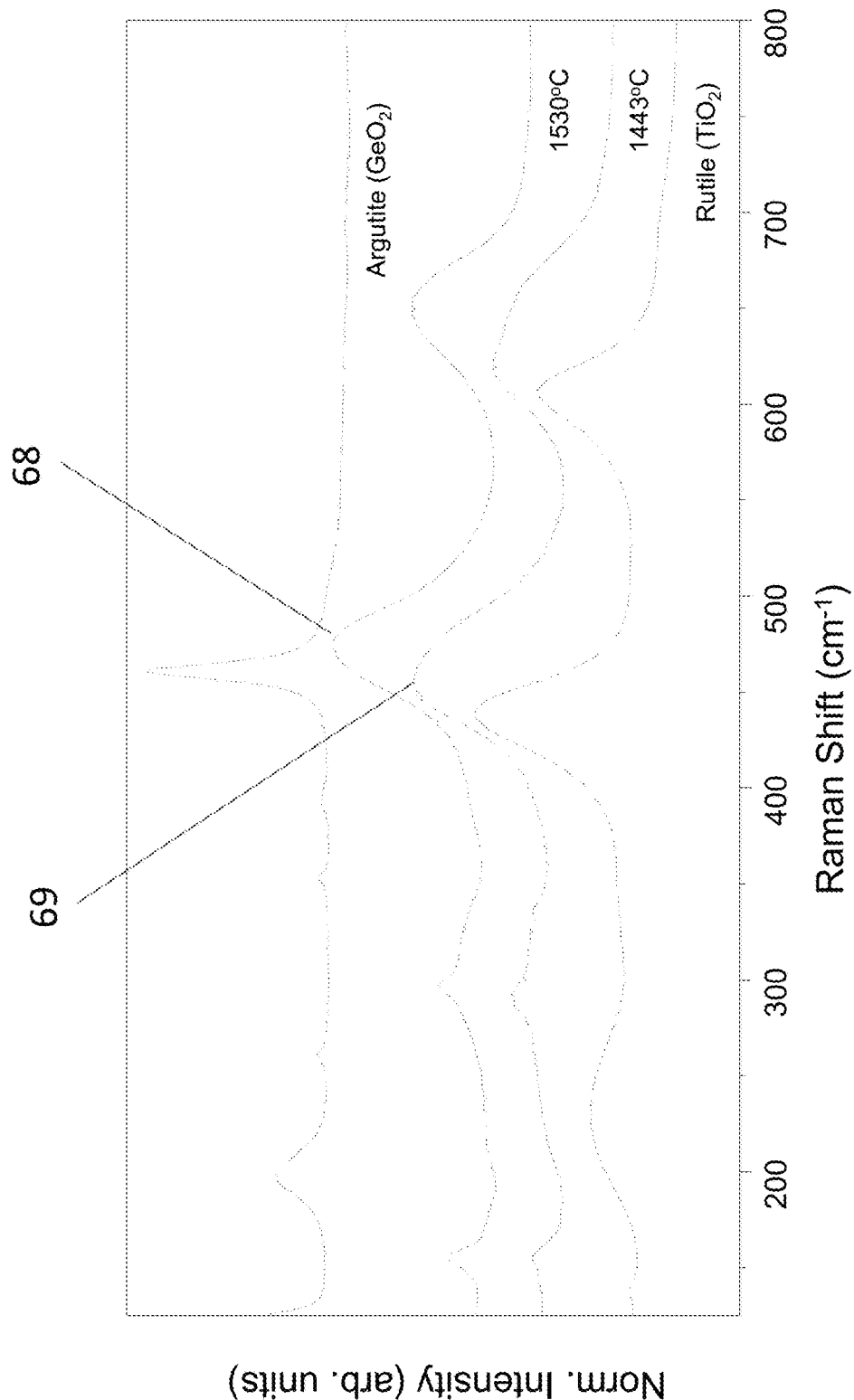
FIG. 6B is the Raman spectra of natural rutile ($TiO_2$) and argutite ($GeO_2$) solid-solution end-members (bottom and top spectra, respectively), and $GeO_2$-rich rutile structured phases at 1443° C. and 1530° C.

FIG. 6A and FIG. 6B shows the Raman spectra of phase pure $GeO_2$ (argutite structure) $TiO_2$ (rutile structure) 62. In FIG. 6A, the Raman spectra of the $TiO_2$ rich phase of the $TiO_2$/$GeO_2$ solid solution 63 is also given for comparison. It can be seen that the Raman peak positions 64, 65, 66, 67 shift with changes in the temperature at which the solid solution was formed.

Similarly FIG. 6B shows the Raman spectra of the $GeO_2$ rich phase of the $TiO_2$/$GeO_2$ solid solution. It can be seen that the Raman peak positions 68, 69 shift with changes in the temperature at which the solid solution was formed.

XRD analysis provides further confirmation of the formation of these solid solutions. Lanthanum hexaboride ($LaB_6$) internal standard was used in the XRD analysis, in order to provide an internal reference against which to accurately measure the unit cell lattice parameters of all the phases. The XRD measurements showed that both the $GeO_2$ rich phase and the $TiO_2$ rich phase have a rutile crystal structure. Their lattice parameters correlate with the synthesis temperature. At lower temperatures in the HPHT process, the lattice parameters were nearly identical to those of the JCPDS (Joint Committee on Powder Diffraction Standards) file for the $GeO_2$ phase (JCPDS card #035-0729) and the $TiO_2$ phase (JCPDS card #021-1276). But as the temperature of the HPHT process was increased, the lattice parameters steadily converged. The convergence was dependent on temperature, with greater effects at higher temperature, until the X-ray diffraction patterns fully coalesced at temperatures greater than about >1600° C.

Figure 7:
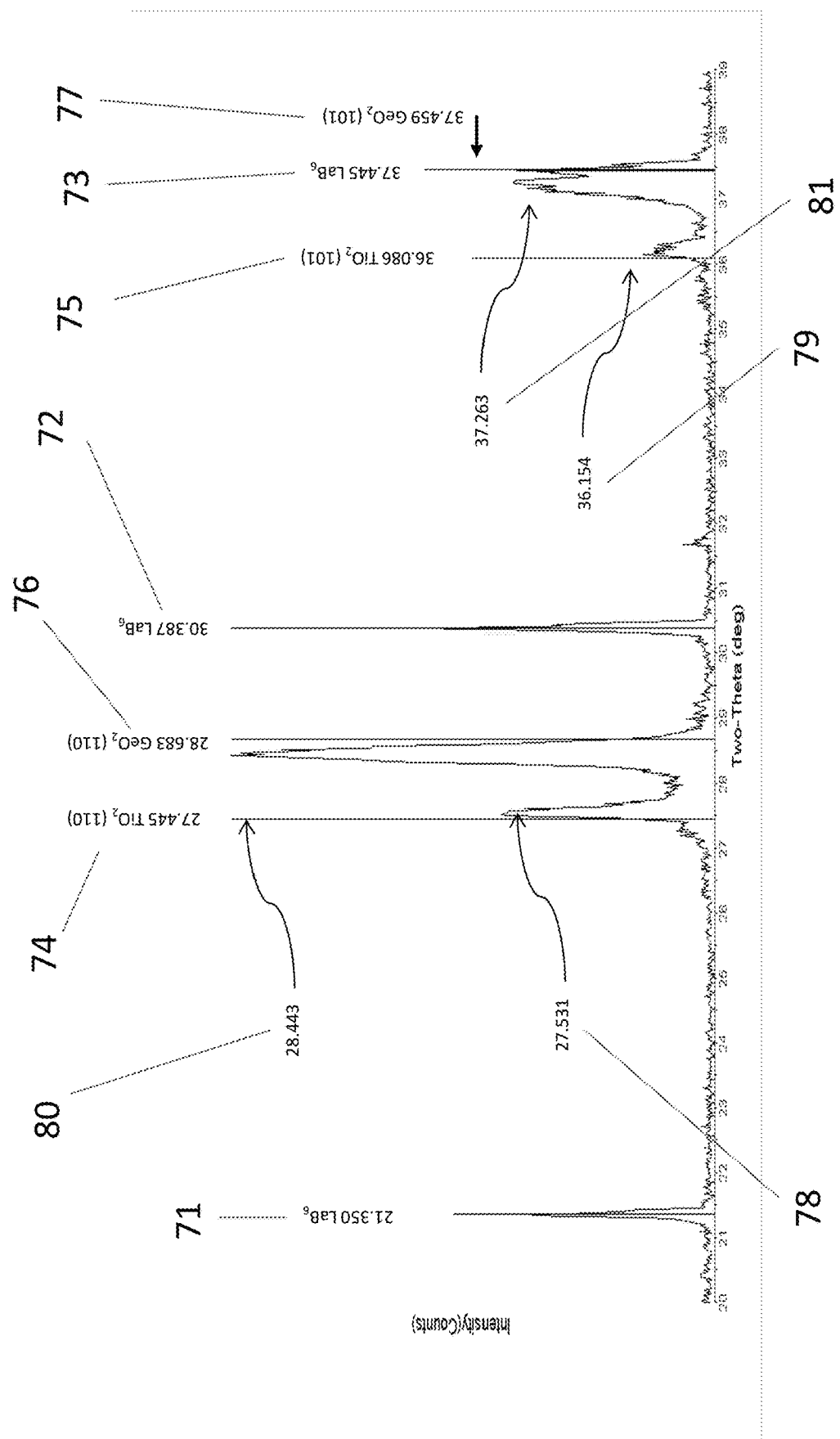
FIG. 7 is a representative X-ray diffraction pattern of $GeO_2/TiO_2$ solid solution, along with the $LaB_6$ standard.

FIG. 7 presents a representative X-ray diffraction pattern, of sample M09-10929. The X-ray diffraction patterns exhibit three diffraction peaks 71, 72, 73, marked by vertical lines and labels, that can be assigned to $LaB_6$, at 21.350°, 30.387°, and 37.445° in 2-theta. As noted above, these were used as an internal reference standard in order to obtain precise locations for the other XRD peaks in the sensor material. Also shown on the XRD pattern are the locations of the $TiO_2$ and $GeO_2$ (110) and (101) reference peaks. These are marked by straight vertical lines and vertical labels on the XRD pattern 74 at 27.445° and 75 at 36.086° respectively for $TiO_2$ and 76 at 28.683° and 77 at 37.459° for $GeO_2$. Note that the reference $GeO_2$ (101) peak almost overlaps one of the $LaB_6$ peaks.

The peaks in the X-ray diffraction pattern arising from the titania rich solid solution are marked by arrows and horizontal labels 78 at 27.531° and 79 at 36.154° in 2-theta. Note that these are slightly higher in 2-theta than the reference $TiO_2$ (110) and (101) peaks. This can be attributed to the effect of the $TiO_2$—$GeO_2$ solid solution, which affects the lattice parameters.

The peaks in the X-ray diffraction pattern arising from the germania rich solid solution are marked by arrows and horizontal labels 80 at 28.443° and 81 at 37.263° in 2-theta. Note also these are slightly smaller in 2-theta than the reference $GeO_2$ (110) and (101) peaks. This can also be attributed to the effect of the $TiO_2$—$GeO_2$ solid solution; in this case the solid solution is rich in $GeO_2$.

Figure 8:
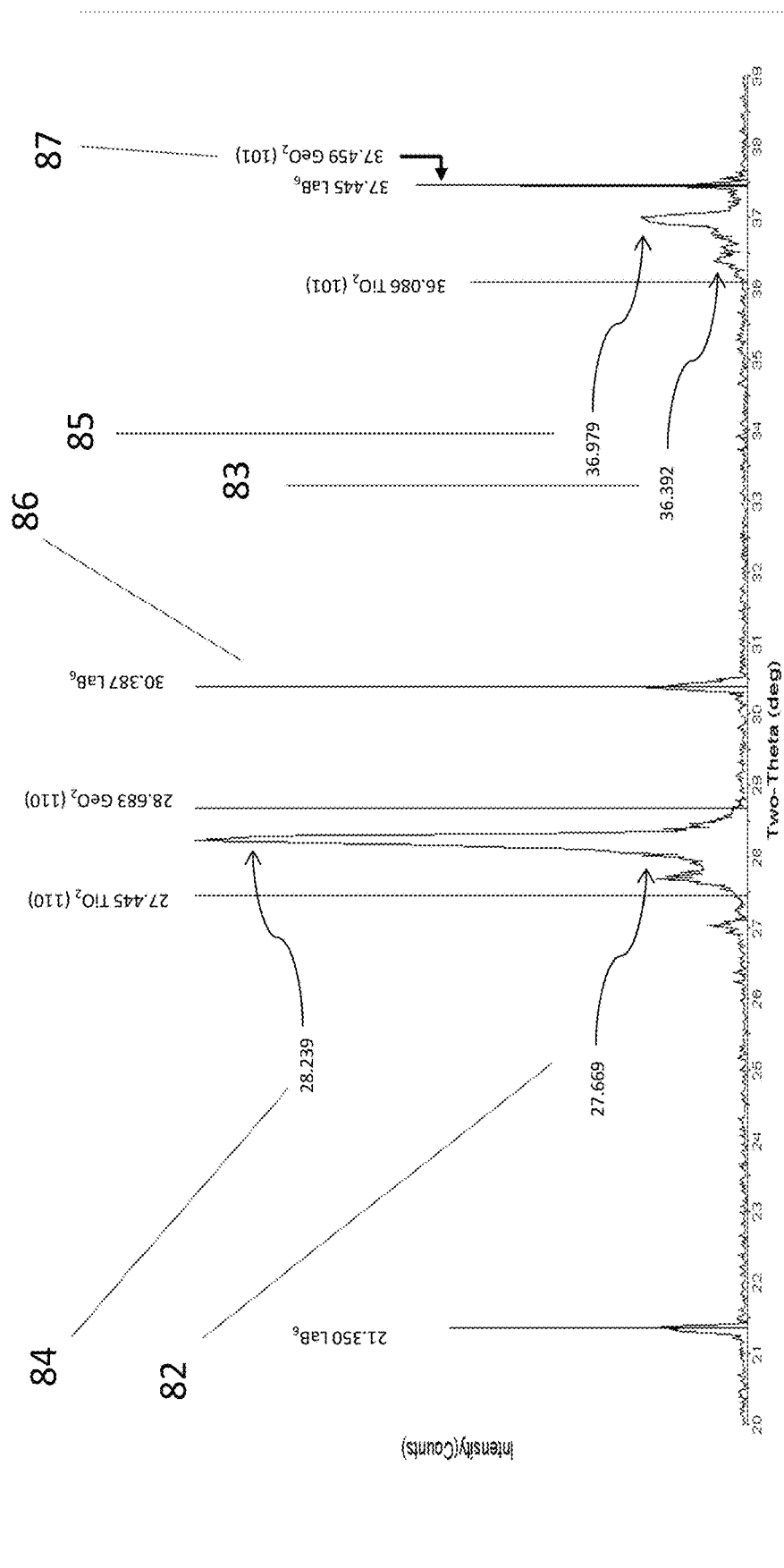
FIG. 8 is a representative X-ray diffraction pattern of $GeO_2/TiO_2$ solid solution, along with the $LaB_6$ standard.

FIG. 8 presents a similar XRD pattern corresponding to sample M09-10930. As discussed in reference to FIG. 7, FIG. 8 includes reference lines for $LaB_6$ and for $TiO_2$ and $GeO_2$ that are marked with vertical labels. However, the peaks arising from the titania rich solid solution are now 82 at 27.669° and 83 at 36.392°, which are slightly higher in 2-theta than before. Additionally, the peaks arising from the germania rich solid solution are now 84 at 28.239° and 85 at 36.979°, which is slightly lower in 2-theta than before.

The position of the X-ray diffraction peaks 78, 79, 80, 81, 82, 83, 84, 85, are influenced by the composition of the solid solution. As the temperature of the HPHT process is increased, more of the solute is incorporated in the solvent of the solid solution. Sample M09-10929 (FIG. 7) was subjected to a temperature of about 1325° C. in the HPHT process; sample M09-10930 (FIG. 8) was subjected to a temperature of about 1512° C. Therefore, as the titania rich solution incorporates more $GeO_2$, the corresponding XRD peaks shift to higher in 2-theta. Conversely, as the germania rich solution incorporates more $TiO_2$, the corresponding XRD peaks shift to lower 2-theta. These XRD peak shifts may form a basis of the temperature measurement under HPHT condition.

The logical conclusion of these XRD peak shifts is that they eventually completely merge to form a homogeneous solid solution to form a new compound. Such a compound, which has never before been observed, has been isolated, and single crystal XRD was used to characterize the clear, colorless, tabular-like crystal specimen. The compound crystallizes in space group P42/m n m (tetragonal) with unit cell dimensions a=b=4.493(2) Å and c=2.9121(13) Å. The chemical formula is $Ge_{0.57}Ti_{0.43}O_2$. The crystal parameters are given in Table 4 and Table 5. The structure drawings are given in FIG. 9.

TABLE 4

| Chemical formula | $GeO_4Ti$ | |
|---|---|---|
| Formula weight | 184.49 g/mol | |
| Temperature | 298(0) K | |
| Wavelength | 0.71073 Å | |
| Crystal size | 0.066 × 0.075 × 0.083 mm | |
| Crystal habit | clear colorless tabular | |
| Crystal system | tetragonal | |
| Space group | P 42/m n m | |
| Unit cell dimensions | a = 4.493(2) Å | $\alpha = 90°$ |
| | b = 4.493(2) Å | $\beta = 90°$ |
| | c = 2.9121(13) Å | $\gamma = 90°$ |
| Volume | 58.79(6) Å$^3$ | |
| Z | 1 | |
| Density (calculated) | 5.211 g/cm$^3$ | |
| Absorption coefficient | 15.938 mm$^{-1}$ | |
| F(000) | 86 | |

TABLE 5

| | x/a | y/b | z/c | U(eq) | F (site occupancy) |
|---|---|---|---|---|---|
| Ge1 | 0.0 | 0.0 | 0.0 | 0.0048(4) | 0.57(3) |
| Ti1 | 0.0 | 0.0 | 0.0 | 0.0048(4) | 0.43(3) |
| O1 | 0.3060(2) | 0.3060(2) | 0.0 | 0.0081(6) | 1.00 |

FIGS. 9A and 9B show atoms. The ball and stick structure FIG. 9A 90 shows the Ge/Ti atoms as dark spheres 91 and the O atoms 92 as light spheres. The bonds 93 between the Ge/Ti atoms 91 and the O atoms 92 are also presented as are the bonds 94 between the Ge/Ti atoms 91. As listed in Table 5, the site occupancy of the Ge and Ti are 0.57 and 0.43 respectively. FIG. 9B 95 also shows the same structure, but the octahedrons 96 emphasize the octahedral coordination of the O atoms 97 around the Ge/Ti atoms enclosed. An O atom 97 is at each vertex of the octahedron 96. The bonds 98 between Ge/Ti atoms are also presented.

It should be noted that a similar detailed analysis could have been done for the Raman spectra or the SEM images in order to derive a temperature correlation.

Figure 10:
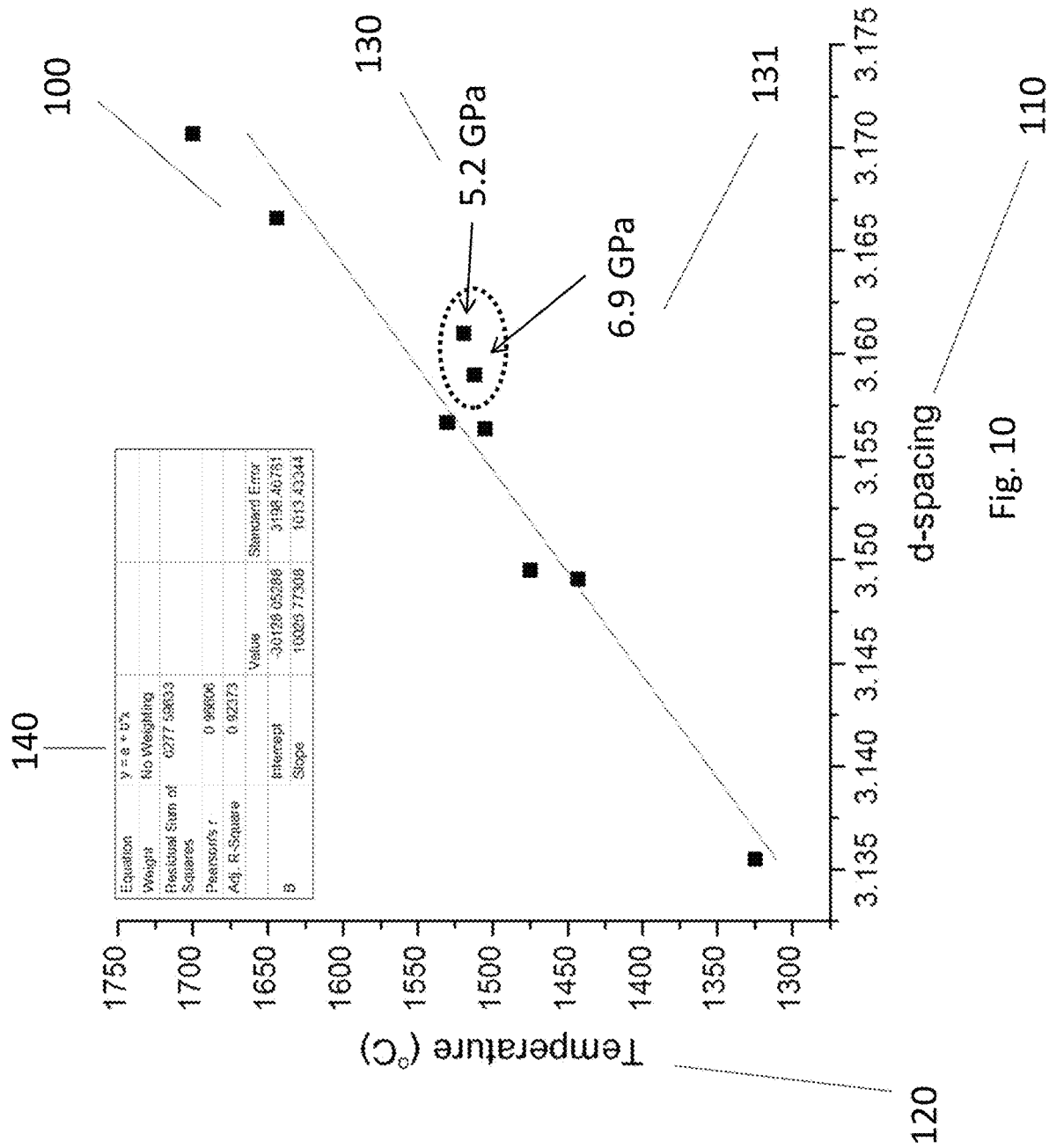
FIG. 10 is a plot of temperature versus d-spacing of the $GeO_2$ rich $GeO_2/TiO_2$ crystalline solid solution. The d-spacing was derived from the X-ray diffraction patterns.

FIG. 10 presents a temperature correlation 100 relating the (110) peak of the $GeO_2$ rich solid solution plot. The temperature 120 ranges from ~1300° C. to ~1700° C. For each data point, the temperature was independently measured and the d-spacing 110 was derived from the XRD data. The pressure was also determined independently for each data point and ranged from ~5.0 GPa to ~7.0 GPa. The two data points 130, 131 that are circled on the plot show the effect of pressure. Both solid solutions were formed at 1520° C. but at two different pressures: at 6.9 GPa 131 and at 5.2 GPa 130. It is apparent that there is some effect of pressure. Despite this, the linear fit is good and temperature can be determined with reasonable precision.

The temperature can now be related to the d-spacing of the (110) peak of the $GeO_2$ rich solid solution: $y=A+B\times x$ 140. Where y is the temperature and x is the d-spacing and the constants, A and B. The data is also listed in Table 4. It should be noted that any of the relevant peaks in the XRD data can be used to build a temperature calibration curve. Multiple such curves can yield more accuracy in the measurement.

TABLE 4

| | Value | Error |
|---|---|---|
| A | −30128 | 3198 |
| B | 10027 | 1013 |

It should now be understood that a sensor material may be incorporated into a HPHT process to evaluate the conditions of the HPHT process ex post. The particular conditions of the HPHT process, for example the maximum temperature that the sensor material is exposed to, may modify the solid solution composition of the sensor material. In one embodiment, the sensor material may undergo a phase transformation to a crystalline solid solution during the HPHT process, where the phase is maintained after the sensor material is brought to ambient pressure and temperature conditions. The sensor material may be evaluated according to a variety of conventional inspection techniques, to determine the composition of the solid solution, which is correlated to the maximum temperature experienced by the sensor material in the HPHT process.

Although the present description includes description of particular embodiments, many other variations and modifications and other uses will become apparent to those skilled in the art. It is preferred therefore, that the scope of the present disclosure be limited not by the specific disclosure herein, but only by the appended claims.

What is claimed is:

1. A method of measuring temperature in a high pressure high temperature (HPHT) process, comprising:
    subjecting a quantity of a sensor material to an HPHT process having a pressure of up to about 10 GPa and a temperature of up to about 1700° C. to modify a solid solution composition of the sensor material;

recovering the sensor material from the HPHT process; and determining the temperature in the HPHT process by evaluating a crystalline structure of the recovered sensor material to determine the solid solution composition of the sensor material.

2. The method of claim 1, wherein the sensor material comprises at least two compounds.

3. The method of claim 1, wherein the sensor material is crystalline prior to subjecting the sensor material to the HPHT process.

4. The method of claim 1, wherein the sensor material is amorphous prior to subjecting the sensor material to the HPHT process.

5. The method of claim 1, wherein the sensor material comprises $TiO_2$ and $GeO_2$.

6. The method of claim 5, wherein $TiO_2$ and $GeO_2$ are provided in a molar ratio from about 30:70 to about 70:30.

7. The method of claim 5, wherein $TiO_2$ and $GeO_2$ are provided in a molar ratio from about 40:60 to about 60:40.

8. The method of claim 1, wherein the sensor material exhibits a crystalline lattice structure that corresponds to the solid solution composition.

9. The method of claim 8, wherein the crystalline lattice structure of the sensor material is evaluated using at least one of electron microprobe, X-ray diffraction, or Raman spectroscopy.

10. The method of claim 8, further comprising determining a maximum temperature experienced by the sensor material in the HPHT process based on the evaluated crystalline lattice structure of the sensor material.

11. The method of claim 10, further comprising characterizing a non-uniform maximum temperature experienced by the sensor material in the HPHT process based on a non-uniform crystalline lattice structure of the sensor material.

* * * * *